United States Patent
Larsen et al.

(10) Patent No.: US 8,411,877 B2
(45) Date of Patent: Apr. 2, 2013

(54) TUNING AND DAC SELECTION OF HIGH-PASS FILTERS FOR AUDIO CODECS

(75) Inventors: Christian Larsen, Irvine, CA (US); Lorenzo Crespi, Costa Mesa, CA (US); Mouna Elkhatib, Tustin, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 643 days.

(21) Appl. No.: 12/578,477

(22) Filed: Oct. 13, 2009

(65) Prior Publication Data

US 2011/0087346 A1    Apr. 14, 2011

(51) Int. Cl.
*H03G 5/00*    (2006.01)
*H03G 9/00*    (2006.01)

(52) U.S. Cl. .......................... 381/98; 381/102
(58) Field of Classification Search ............. 381/98–103
See application file for complete search history.

(56) References Cited

U.S. PATENT DOCUMENTS

| | | | |
|---|---|---|---|
| 3,875,334 A * | 4/1975 | Hilbert et al. ................... 381/98 |
| 4,139,866 A * | 2/1979 | Wegner ......................... 348/738 |
| 4,327,250 A * | 4/1982 | von Recklinghausen ....... 381/55 |
| 5,255,323 A * | 10/1993 | Ishihara et al. ................ 381/103 |
| 5,621,355 A | 4/1997 | Williams et al. |
| 5,625,316 A | 4/1997 | Chambers et al. |
| 6,085,259 A * | 7/2000 | Rode et al. ........................ 710/9 |
| 6,404,276 B1 | 6/2002 | Liu |
| 6,429,733 B1 | 8/2002 | Pagliolo et al. |
| 6,763,113 B2 * | 7/2004 | Maejima ....................... 381/109 |
| 2003/0040822 A1 * | 2/2003 | Eid et al. ........................ 700/94 |
| 2006/0041895 A1 | 2/2006 | Berreth |
| 2006/0253288 A1 | 11/2006 | Chu et al. |
| 2007/0180137 A1 | 8/2007 | Rajapakse |
| 2007/0269055 A1 * | 11/2007 | Erath .............................. 381/96 |
| 2011/0103618 A1 * | 5/2011 | Lemellat et al. .............. 381/119 |

OTHER PUBLICATIONS

"High Definition Audio Specification", Intel, Apr. 15, 2004, pp. iii-174, Revision 1.0, Intel Corporation, USA.

* cited by examiner

*Primary Examiner* — Jesse Elbin
(74) *Attorney, Agent, or Firm* — Jackson Walker L.L.P.; Christopher J. Rourk

(57) ABSTRACT

An integrated audio codec includes a high-pass filter to prevent damage to personal computer speakers and other components. The audio codec may be compliant with HD audio standards and can operate with generic software drivers. Tuning of the high-pass filter is provided through an external pin-out where either an external capacitor or external resistors provide an ability to tune the high-pass filter. In one implementation, a tuning voltage is digitized into a tuning code used by a digital high-pass filter. In addition, multiplexers can be used to insure only the audio path leading to the speakers is filtered.

20 Claims, 8 Drawing Sheets

TUNING AND DAC SELECTION OF HIGH-PASS FILTERS FOR AUDIO CODECS

BACKGROUND OF THE INVENTION

1. Field of the Invention

The present invention relates generally to audio codecs and specifically with the tuning of high-pass filters within audio codecs.

2. Related Art

Excessive low frequency ("bass") sounds are often problematic for personal computers (PC). Both internal and external speakers on PCs are typically small and can be damaged if too much power is delivered at low frequencies. Excessive low frequency sound may also cause problems with components within a personal computer. For example, the vibrations from low frequency sound can lead to data corruption and even failure of a hard drive device. FIG. 1 shows a prior art system which attenuates harmful low frequency signals. The audio signal is supplied by HD audio driver 102, which is filtered by high-pass filter 104 and drives speaker 106.

The advent of high definition (HD) audio standards in PCs has imposed certain audio performance requirement on external outputs, such as headphones or microphone jacks. However, such requirements are not imposed on integrated speakers which allows a high-pass filter to be inserted into the audio path to integrated speakers. The HD-audio standards also allow for individual digital to audio converters (DACs) to be assigned to arbitrary audio paths. Under the standard, the HD codec must operate with a generic audio driver. Therefore, if a high-pass filter is included in the audio path, specialized driver software would not be available to enable or adjust it and the high-pass filter must be automatically tuned or set in the factory by a vendor.

These limitations are not an obstacle to HD audio codecs where low impedance drivers, such as speaker drivers, are separate from the audio codec. A user or vendor could place a high-pass filter between the output of the codec and the speaker driver, leaving all other audio paths unfiltered.

FIG. 2 illustrates a HD audio system as known in the art. Integrated circuit 210 comprises DAC 202 and line driver 206 for a speaker path and DAC 204 and headphone driver 208 for the headphone path. DAC 202 and DAC 204 receive audio input from HD audio interface 260 as digital data. DAC 202 and DAC 204 each convert their respective digital audio signals into an analog audio signal. The analog audio signal passed to line driver 206 is amplified and provided to line output 252 which can be connected to a speaker driver. The analog audio signal passed to the headphone driver is provided to headphone output 254 which may be connected to a jack, where headphone 244 could be attached. The line out analog audio signal does not have sufficient power to drive a speaker, so speaker driver 232 is employed to amplify the audio signal to drive speaker 242 in a low impedance interface. In this system, speaker driver 232 is provided on integrated circuit 230 which is separate from integrated circuit 210. In order to prevent damage to speaker 242, high-pass filter 220 is inserted into the audio path between line driver 206 and the speaker driver 232. This high-pass filter can be a resistor 214 connected to ground and capacitor 212 in series with the audio path as shown in the figure.

Because the desired frequency response of the high-pass filter is often based on the speaker characteristics, the speaker manufacturer either supplies or specifies requirements for the high-pass filter. In the architecture shown in FIG. 2, neither the manufacturer of integrated circuit 210 nor the manufacturer of integrated circuit 230 needs to know the requirements of the high-pass filters.

In today's trend of further integration, integrated circuits, audio codecs are being integrated with the speaker drivers on the same chip. This complicates access to the audio path for the insertion of a high-pass filter. Therefore, there is a need in the industry to insert a high-pass filter into an HD audio path while meeting HD audio requirements including compatibility with a generic software driver, that is, without the ability to tune the high-pass filter through software.

SUMMARY OF INVENTION

One embodiment of an integrated audio driver in an HD audio environment comprises in the speaker audio path a digital high-pass filter, a DAC that converts the filtered audio signal to an analog audio signal, a speaker driver that drives speakers with the analog audio signal and a control signal which receives external tuning information and configures the digital high-pass filter based on the tuning information.

In one variation, the tuning information the tuning information is a voltage received at an integrated circuit pin-out and the control circuit converts the voltage into a control code supplied to the digital high-pass filter. This voltage can be produced by an external voltage divider comprising two resistors. The digital high-pass filter can be deactivated when the voltage is essentially the ground potential. A pull-down resistor can be coupled to the integrated circuit pin-out so that the digital high-pass filter is deactivated if nothing is connected to the integrated circuit pin-out.

The integrated audio driver can also comprise another DAC and headphone driver placed in the headphone audio path. The selection of either DAC for either audio path can be accomplished through three digital multiplexers and two analog multiplexers. The first selects which audio path is supplied to the digital high-pass filter, the second selects which audio path is supplied to the first DAC, and the third selects which audio path is supplied to the second DAC a second digital multiplexer operable to select the first digital audio signal or the filtered digital audio signal as an input signal to the DAC. The first analog multiplexer selects which analog signal is sent to the speaker driver and the second analog multiplexer selects which analog signal is sent to the headphone driver. In addition a high-pass filter control circuit can be used to control the three digital multiplexers on the basis of a DAC select signal and a speaker driver enable signal.

An alternate embodiment of the integrated audio driver in an HD audio environment comprises a DAC to convert a digital audio signal to produce an analog audio signal, an portion of an analog filter coupled to an external capacitor, where the portion of the analog filter and the external capacitor comprise a high-pass filter which filters the analog audio signal, and a speaker driver that drives speakers based on the filtered analog audio signal and to drive a speaker.

One embodiment of the portion of the analog filter can comprises an analog subtractor that receives the analog signal, an amplifier coupled to the analog subtractor that produces a filtered analog audio signal, a transconductance element that produces a current proportional to the filtered analog audio signal through the external capacitor. The voltage of the external capacitor is supplied to the analog subtractor where the voltage is subtracted from the analog audio signal.

Other systems, methods, features, and advantages of the present disclosure will be or become apparent to one with skill in the art upon examination of the following drawings

Figure 1:
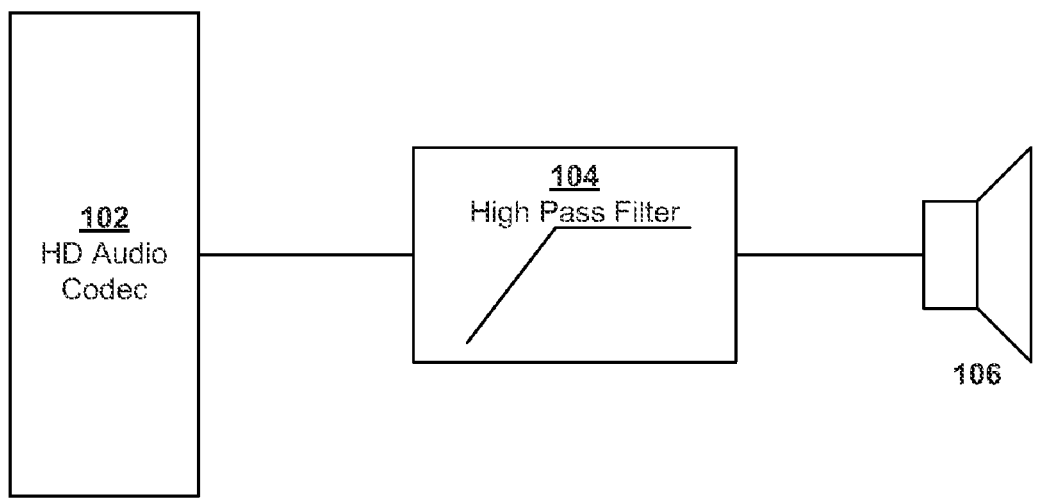
FIG. 1 shows generically a system which attenuates harmful low frequency signals.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

For clarity, the connections between components in the figures in this disclosure are represented by a single line. However, these connections can be single-ended or differential. In addition the integrated circuit outputs and headphone outputs are shown as a single node, but may be either a single-ended or differential output. Additionally, each output node is intended to represent an output interface for an integrated circuit and can be implemented in any number of packaging techniques including but not limited to flip-chip bump, a pin, a pad, or a solder ball. While the technology may vary, each of these outputs is referred to as a pin-out. In the case of a differential output, each node represents two pin-outs. In addition since the HD audio codec may be integrated with the HD audio interface no explicit input node is shown leading to the individual DACs. In the event the HD audio codec resides on a separate IC from the HD audio interface input pin-out(s) would be needed.

Figure 3:
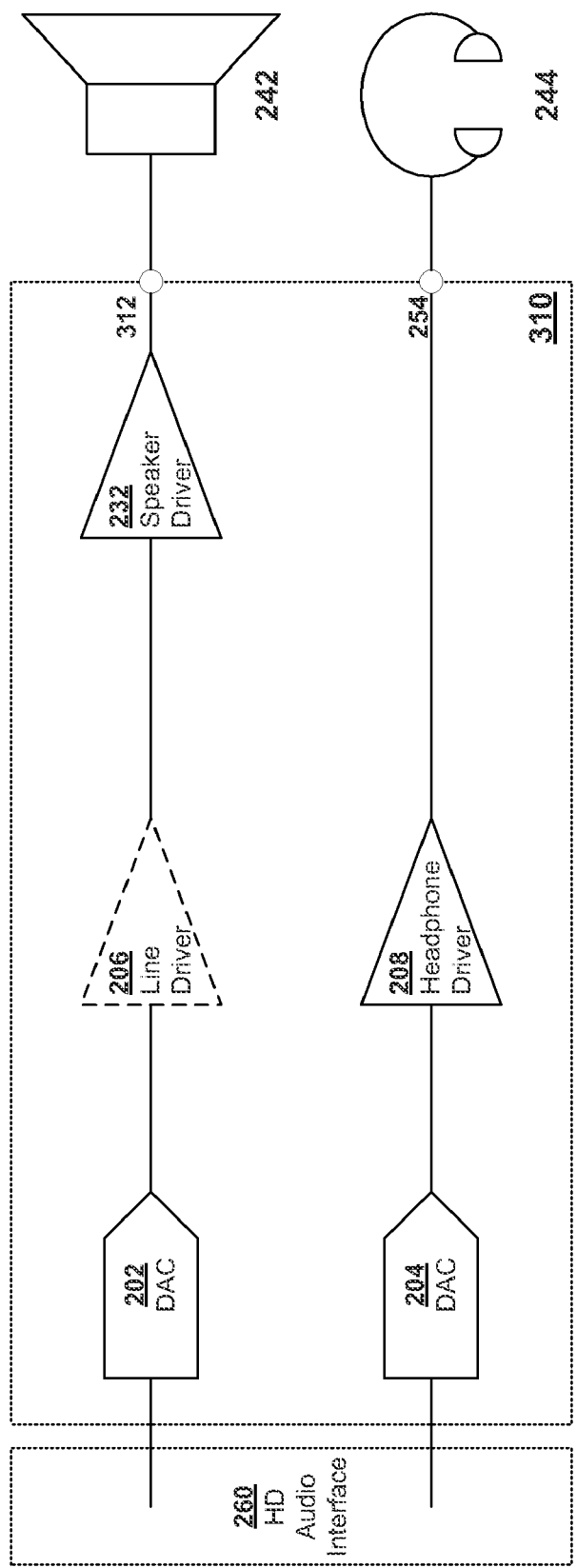
FIG. 3 illustrates an HD audio codec with the speaker driver integrated on the same integrated circuit.

One naïve approach to introducing a high-pass filter to the HD audio path shown in FIG. 3 is to add the high-pass filter to the output of integrated circuit 310. However, for a high-pass filter to operate in this configuration, the filter would have to simultaneously operate at much high power, exhibit the desired frequency response, and provide a low impedance interface for speaker 242. Meeting three criteria above would prove to be cost prohibitive especially in a PC speaker environment and such a solution would just simply not be considered.

Figure 2:
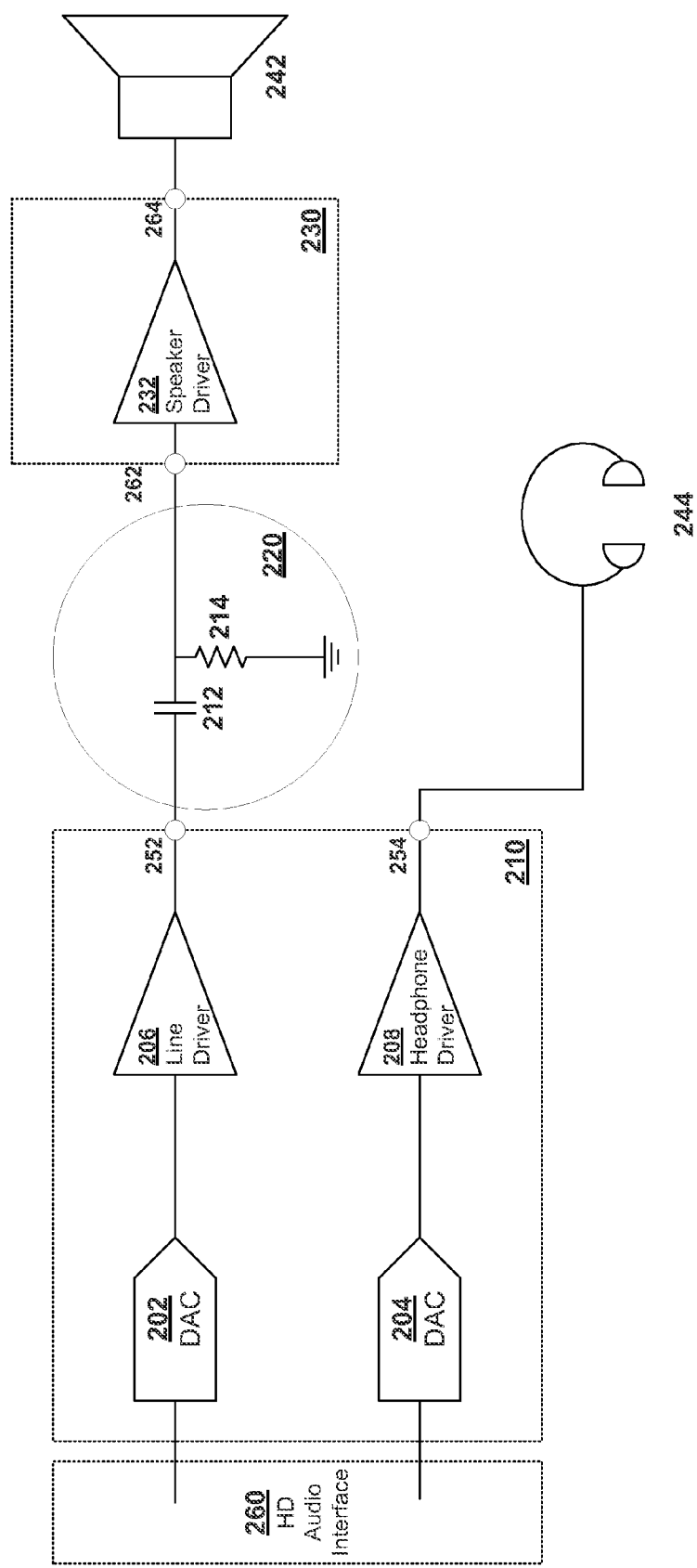
FIG. 2 illustrates a typical HD audio system.

Another approach is to mimic the configuration in FIG. 2. The output of line driver 206 would be sent off chip where it could be filtered where the filtered signal could be brought on chip and supplied top speaker driver 232. In this configuration, a line driver would likely be necessary.

Figure 4:
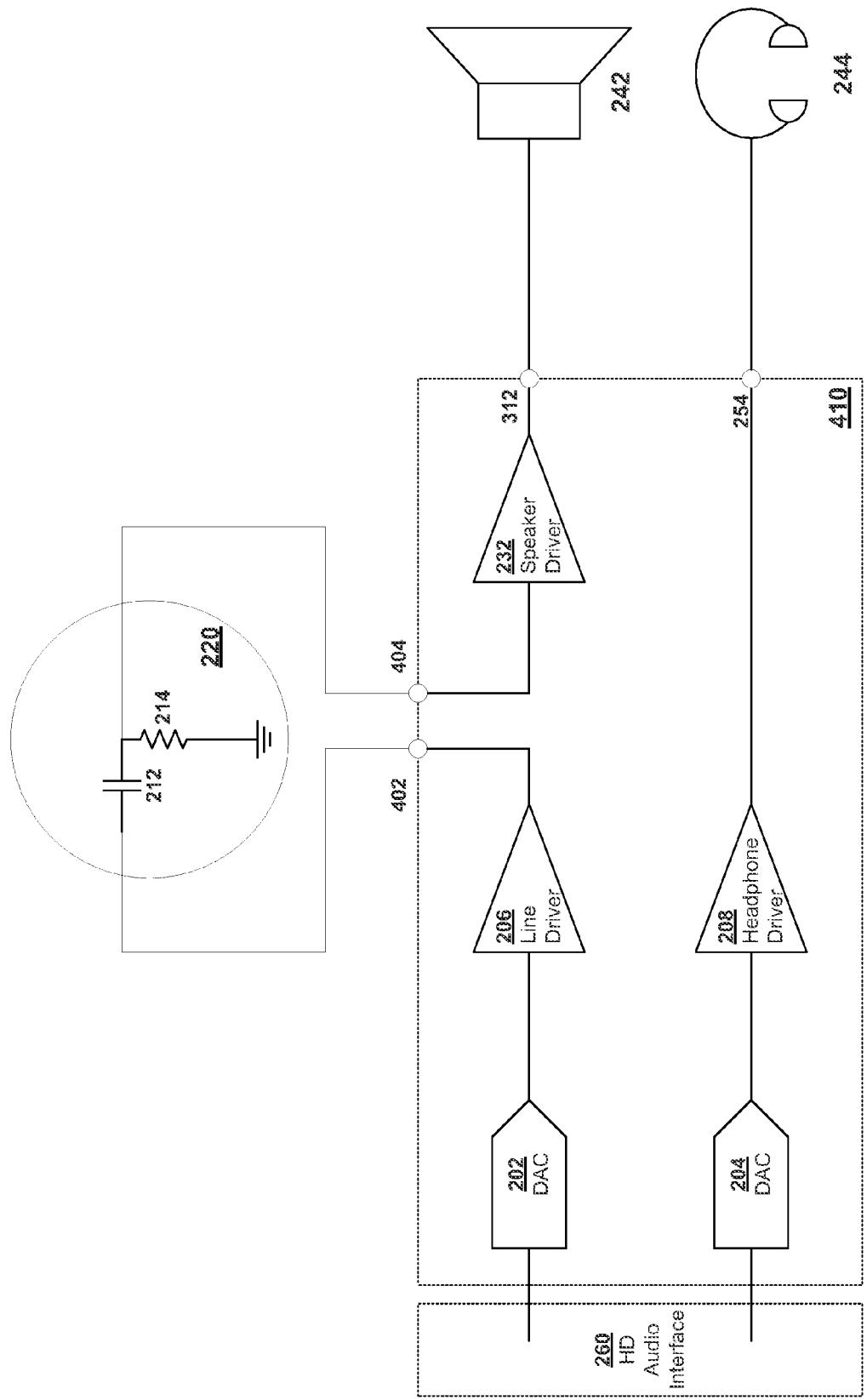
FIG. 4 illustrates a version of an integrated HD audio codec where the high-pass filtering is sent off chip.

FIG. 4 illustrates a version of an integrated HD audio codec where the high-pass filtering is sent off chip. Integrated circuit 410 is similar to integrated circuit 310 except that it provides access to the interface between line driver 206 and speaker driver 232 through pins 402 and 404. High-pass filter 220 which was also described in its use in system 200 can then be connected to pins 402 and 404 to yield a circuit which is essentially the same as shown in system 200. In this arrangement, the manufacturer of the speaker can supply the high-pass filter which best suits the characteristics of the speaker, and the manufacturer of the HD audio codec can provide an HD audio codec which is not dependent on the characteristics of the speaker.

While shown in FIG. 4 as requiring an additional 2 interface nodes, in actuality there are at least a left and right channel so two interface nodes are required for each channel bringing the total to four interface nodes. In high fidelity applications, the interfaces between the DAC and the speaker driver are differential rather than single-ended so each node could actually represent 2 pin-outs. This would lead to 4 pin-outs per channel giving a total of 8 pin-outs. The additional pin-outs adds expense to the manufacture and packaging of an integrated circuit.

Figure 5:
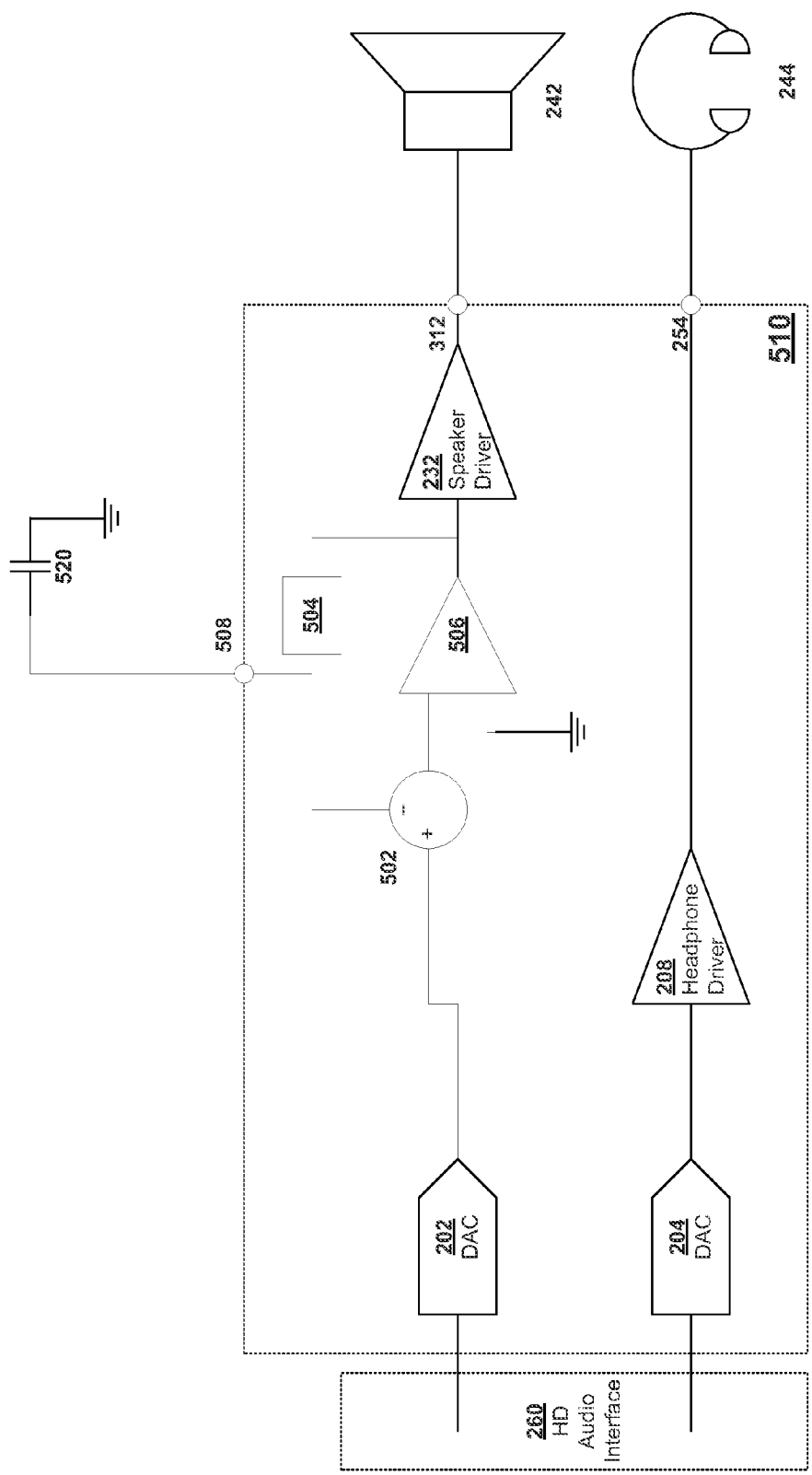
FIG. 5 illustrates an integrated audio codec provides a tunable analog high-pass filter between a DAC and a speaker driver.

FIG. 5 illustrates an embodiment of an integrated audio codec 510 providing a tunable analog high-pass filter between DAC 202 and speaker driver 232. An analog high-pass filter is inserted between DAC 202 and speaker driver 232 and comprises amplifier 506, feedback subtractor 502 and transconductance element 504. In this embodiment, a capacitor 520 is provided off-chip, to reduce the difficulty and cost associate with fabricating a capacitor with high capacitance on the chip 510. The capacitor 520 is connected to the high-pass filter through output node 508.

In addition to using an off-chip capacitor 520 to provide capacitance for the high-pass filter by selecting from difference capacitance for capacitor 520, the high-pass filter can be tuned. For example, the cut off frequency of the high-pass filter can be adjusted by adjusting the capacitance coupled to pin 508. In operation, transconductance element 504 produces a current proportional to the output voltage of amplifier 506. This current is driven into external capacitor 520. The voltage across the capacitor is proportional to the integral of the current driven through it. This voltage is sampled by feedback subtractor 504 and subtracted from the output of DAC 202 and supplied to amplifier 506 thus completing the feedback loop.

The embodiment of FIG. 5 illustrates an audio high-pass filter for a single audio channel. This solution may be extended to additional audio channels, such as each channel in a stereo PC, by adding two high-pass filters along with corresponding pins and capacitors.

Figure 6:
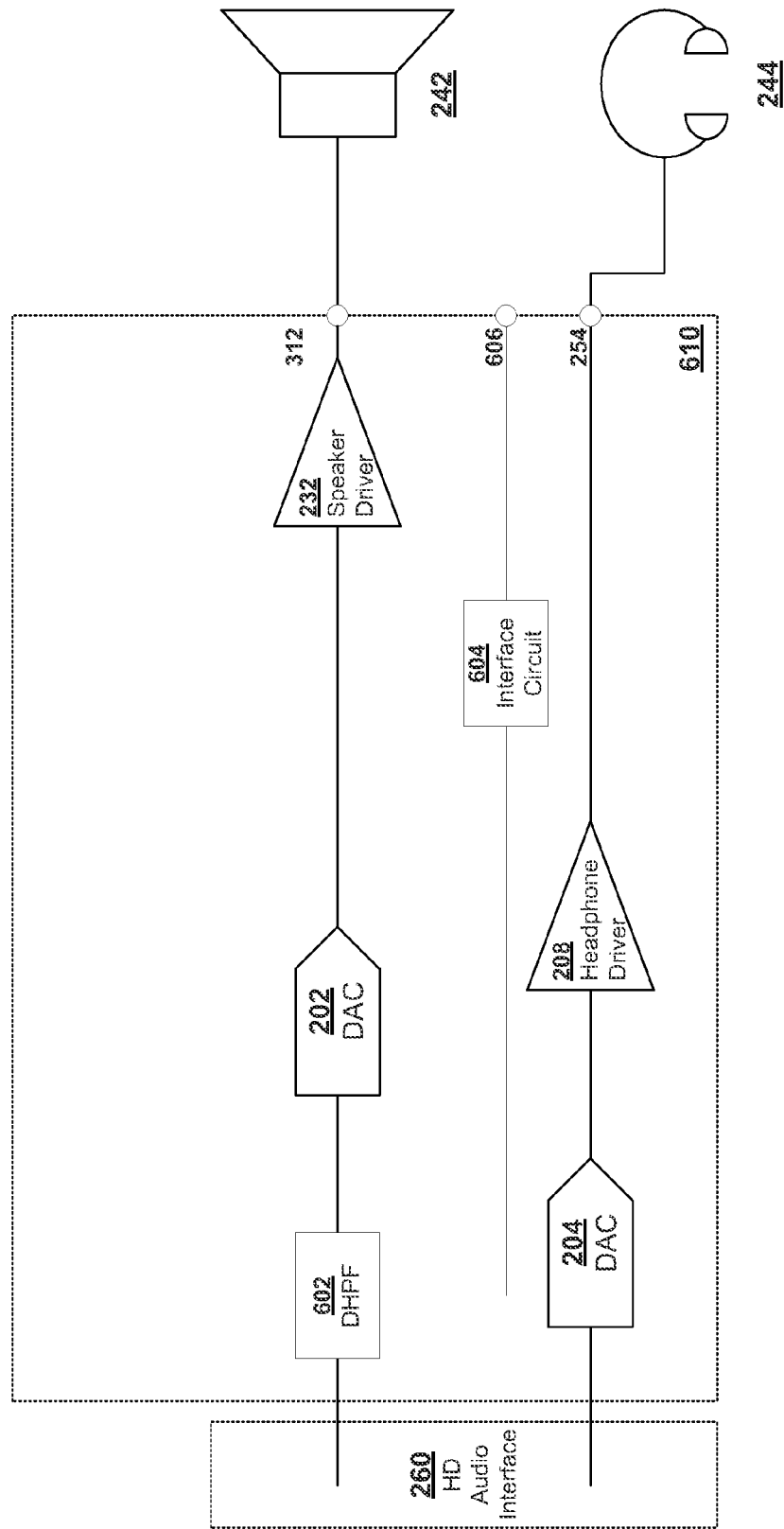
FIG. 6 illustrates an embodiment of an integrated audio codec employing a digital high-pass filter.

FIG. 6 illustrates an embodiment of an integrated audio codec employing a digital high-pass filter. When integrated circuit 610 receives a digital audio signal destined for speaker 242, it passes through digital high-pass filter 602 which removes potentially damaging low frequency signals. The filtered digital audio signal is then passed to DAC 202 which converts the audio signal to analog. Speaker driver 232 drives speaker 242 with the analog audio signal. Digital high-pass filter 602 is controlled by interface circuit 604 which receives tuning information through pin 606. In one embodiment, interface circuit 604 receives tuning information through pin 606 to control a plurality of digital high-pass filters for each of a plurality of audio channels used such as two channels in a stereo PC application.

The digital signal received through pin 606 includes configuration information for DHPF 602, which may include digital filter coefficients. The digital signal may be provided by an additional external digital circuit that would be powered on and coupled to the HD audio codec or, in alternative embodiment, by discrete circuit components.

Figure 7:
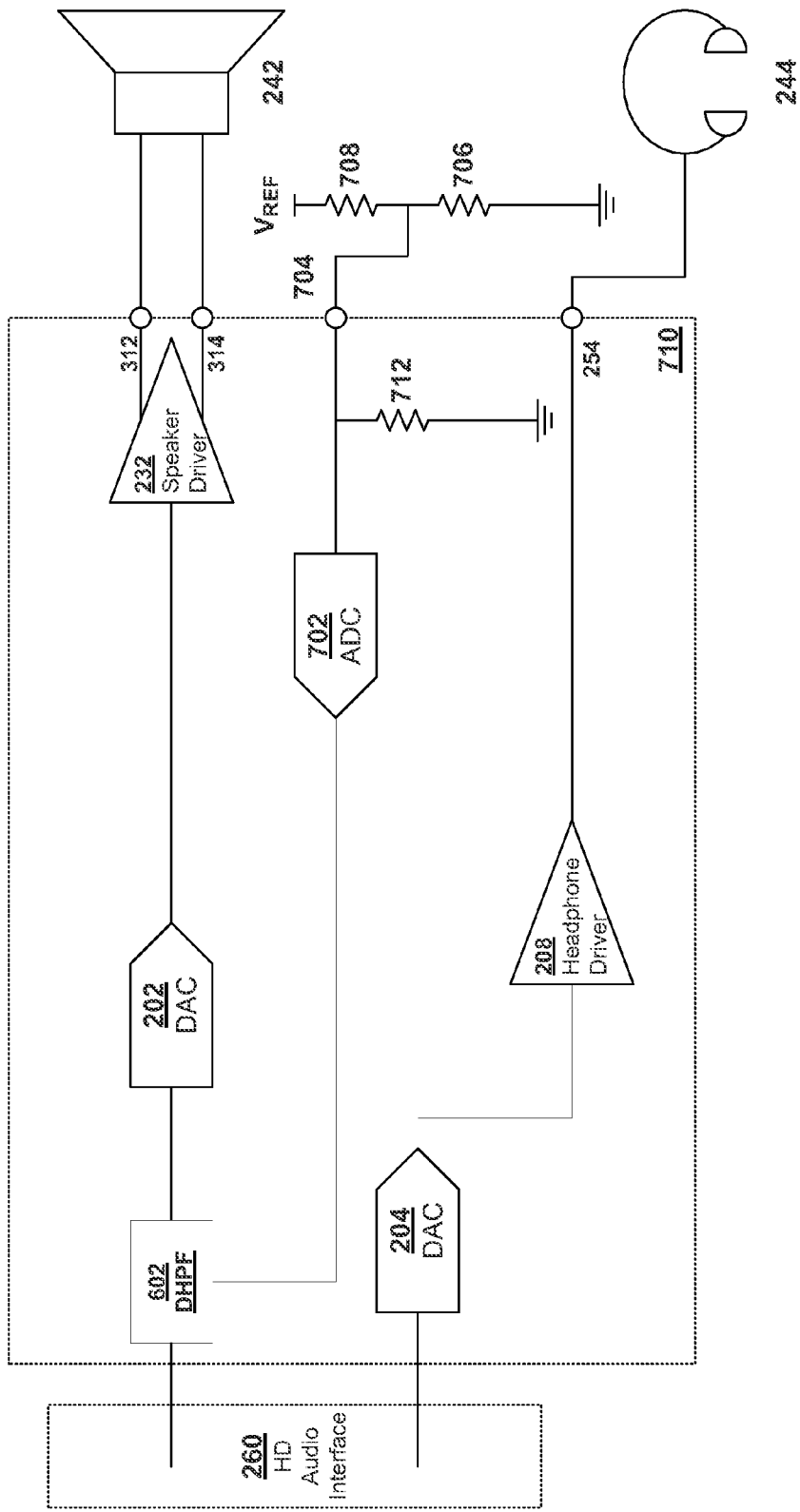
FIG. 7 is an example of an integrated audio codec with a simple method of external tuning of a digital high-pass filter.

FIG. 7 is an example of an integrated audio codec where the digital high-pass filter is tuned using discrete components. In this embodiment, the characteristic of the high-pass filter to be tuned is the cut off frequency, which could be represented by a single numeric value. The interface circuit is ADC 702 which receives a tuning voltage at pin 704. The tuning voltage is a fraction of a reference voltage such as the supply voltage. ADC 702 converts the voltage at pin 704 into a digital code. The digital code is used as a tuning parameter for digital high-pass filter 602. In one embodiment, the digital code is mapped to the cut off frequency of digital high-pass filter 602.

As illustrated, a pair of external resistors function as a voltage divider. The voltage at pin 704 is proportional to the ratio of the resistances of resistor 706 and resistor 708. For example, if the resistance of resistor 706 is $R_1$ and the resistance of resistor 708 is $R_2$. The voltage seen at pin 704 is $$\frac{R_2}{R_1 + R_2} V_{REF}.$$

With the appropriate choice of resistances, this resistor divider can produce any voltage between ground and $V_{REF}$.

The tuning parameter can be read upon startup of the HD audio codec or when the speaker path is activated, and that parameter can be used until the speaker path is deactivated or the HD audio codec is shutdown. Alternatively the tuning parameter can be periodically read by the ADC and the digital high-pass filter updated. Because the operation of the ADC does not need to be instantaneous, slower methods of reading the voltage at pin 704 can be used such as the use of a successive approximation ADC which comprises a successive approximation register (SAR), a sample hold, a comparator and a DAC. A successive approximate ADC can require several clock cycles to measure the voltage seen at pin 704.

In addition to selecting a tuning parameter, this interface can also enable or disable the digital high-pass filter. For example, a code of "0" received through pin 704 can be used by the ADC 702 to disable digital high-pass filter 602. This would correspond to a ground voltage at pin 704. Optionally, a high impedance such as pull-down resistor 712 on integrated circuit 710 could be used to tie the voltage seen at pin 704 to ground when pin 704 is not connected to external circuitry. In this fashion, if no external circuitry is connected to pin 704, then the digital high-pass filter is disabled. If resistor 712 is selected to be high enough, it would have negligible impact on a voltage at pin 704 when a resistor divider is attached.

In the embodiments of FIGS. 5, 6 and 7, a high-pass filter is placed in the audio path for a speaker. This high-pass filter can be tuned and enabled through the use of an external circuit, such as two external resistors as a resistor divider. One advantage of the digital solutions over the analog solution is that by using a digital high-pass filter, the frequency response for a given tuning parameter can be selected, whereas often times in an analog filter several capacitors or inductors may be needed to maintain a desired frequency response for a particular cut off frequency.

The HD audio specifications permit an HD audio interface to receive instructions from the operating system to select which of a plurality of DACs in an HD audio codec is connected to a particular output (e.g., headphone or speaker) and to enable or disable the particular output driver (e.g., headphone driver or speaker driver.)

Figure 8:
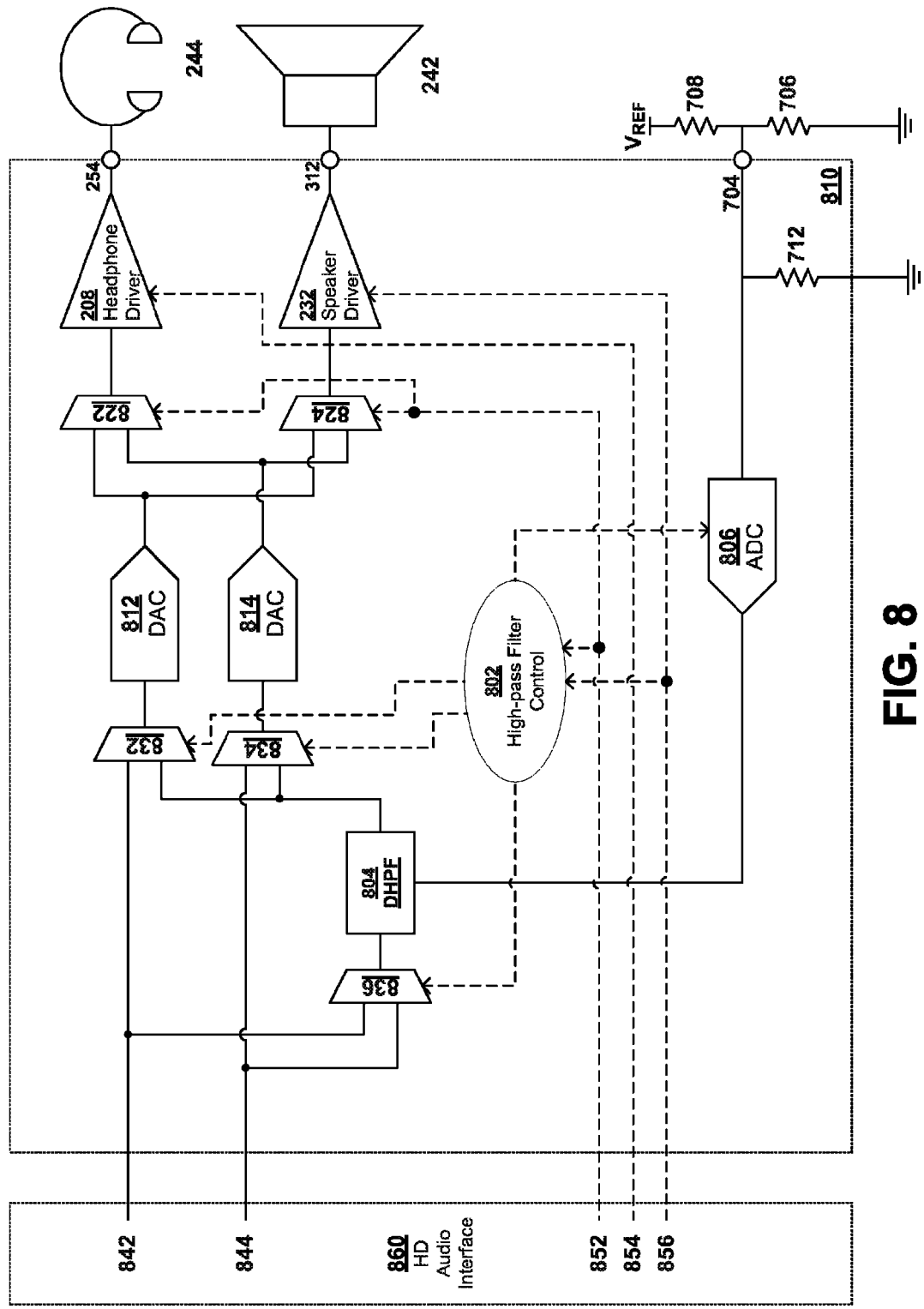
FIG. 8 shows an integrated audio codec which has selectable DACs.

FIG. 8 shows an embodiment of an integrated audio codec which has selectable DACs. Codec 810 supports the HD audio feature permitting the selection of the DAC and insures that when a DAC is connected to the speaker path, the digital high-pass filter is inserted into the digital portion of the signal path. In this example, two DACs are shown, but it should be understood this approach works for an arbitrary number of DACs. Codec 810 comprises DAC 812 and DAC 814, multiplexers (mux) 822 and 824, speaker driver 232 and headphone driver 208. Signal 852 received from an HD audio interface is the DAC selection signal. Signal 852 can assign DAC 812 to either headphone driver 208 or speaker driver 232. It can also simultaneously assign DAC 814 to the opposite driver (e.g., if DAC 812 is assigned to the headphone driver then DAC 814 can be assigned to speaker driver 232.) Alternatively, signal 852 can leave DAC 812 or DAC 814 unassigned. Signal 854 is the headphone driver enable signal which enables or disables headphone driver 208. Signal 856 is the speaker driver enable signal which enables or disables speaker driver 232. Signals 854 and 856 are received from the HD audio interface.

In order to incorporate the tuned high-pass filter into the appropriate signal path, codec 810 includes high-pass filter control circuit 802. High-pass filter control circuit 802 receives a copy of DAC selection signal 852 and speaker driver enable signal 856. Additionally, codec 810 includes mux 832, mux 834 and mux 836 along with digital high-pass filter 804 and ADC 806. If selection signal 852 assigns DAC 812 to speaker driver 232 and signal 856 enables speaker driver 232, high-pass filter control circuit 802 enables ADC 806 which can then read the tuning voltage from pin 704. ADC 806 converts the tuning voltage into a tuning parameter for digital high-pass filter 804 as described with reference to FIG. 7.

High-pass filter control circuit 802 inserts digital high-pass filter 804 into the signal path of the speaker by controlling muxes 832, 834, and 836. Specifically, mux 836 is directed to select digital audio signal 842 to be processed by digital high-pass filter 804. Mux 832 is directed to then select the filtered digital audio signal to be processed by DAC 812, which is then sent to speaker driver 232 via mux 824. Meanwhile, mux 834 selects digital audio signal 844 to be processed by DAC 814 directly, which may or may not be processed by additional downstream components (e.g., headphone driver 208). Alternatively, if selection signal 852 assigns DAC 814 to speaker driver 232 and signal 856 enables speaker 232, high-pass filter control circuit 802 again enables ADC 806 so that it can be used to tune digital high-pass filter 804. However, mux 836 is now directed to select digital audio signal 844 to be processed by digital high-pass filter 804. Mux 834 is now directed to select the filtered digital audio signal to be processed by DAC 814, which is then sent to speaker driver 232 via mux 824. Mux 832 now selects digital audio signal 842 to be processed by DAC 814 directly which may or may not be processed by additional downstream components.

Using approach described above for HD audio codec 810, a digital high-pass filter can be inserted into any audio path connected to a speaker leaving all other audio paths unfiltered. This approach leaves the tuning to a tuning voltage which can be generated with two external resistors allowing the HD audio codec to be fully compatible with a generic a generic software driver. In a more advanced audio system, there may be additional speaker drivers. In that case, additional digital high-pass filters could be added controlled by a high-pass filter control. In alternate embodiments, the tuning mechanism can be shared or additional tuning mechanisms could be added.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. An integrated audio driver comprising:
   a digital high-pass filter operable to receive a digital audio signal to produce a filtered digital audio signal;
   a digital to audio converter (DAC) operable to receive the filter digital audio signal from the digital high-pass filter and to produce an analog audio signal;
   a speaker driver operable to receive the analog audio signal and to produce a signal to drive a speaker; and
   a control circuit operable to receive fixed tuning information from an integrated circuit pin-out and to configure the digital high-pass filter on the basis of the tuning information, wherein the tuning information is based on a characteristic of the speaker.

2. The integrated audio driver of claim 1 wherein the tuning information is a tuning voltage and the control circuit comprises an analog to digital converter (ADC) that supplies a control code to the digital high-pass filter.

3. The integrated audio driver of claim 2 wherein the tuning voltage is produced by an external voltage divider comprising two resistors.

4. The integrated audio driver of claim 2 wherein the digital high-pass filter is deactivated when the tuning voltage is essentially the same as the ground voltage.

5. The integrated audio driver of claim 2 further comprising a pull-down resistor coupled to integrated circuit pin-out and a ground, whereby the digital high-pass filter is deactivated when nothing is connected to the integrated circuit pin-out.

6. The integrated audio driver of claim 1 wherein the integrated circuit pin-out is a pin, a pad, a flip-chip bump, or a solder ball.

7. The integrated audio driver of claim 1 further comprising:
   a second DAC operable to receive an second input signal and produce a second analog signal; and
   a headphone driver operable to receive the second analog signal and to drive external headphones.

8. The integrated audio driver of claim 1 further comprising:
   a second DAC operable to receive a second input signal and produce a second analog signal;
   a headphone driver;
   a first digital multiplexer operable to select a first digital audio signal or and a second digital audio signal as the digital audio signal supplied to the digital high-pass filter;
   a second digital multiplexer operable to select the first digital audio signal or the filtered digital audio signal as an input signal to the DAC;
   a third digital multiplexer operable to select the second digital audio signal or the filtered digital audio signal as the second input signal;
   a first analog multiplexer operable to select the analog signal and the second analog signal to drive the speaker driver based on a DAC select signal from an HD-audio interface;
   a second analog multiplexer operable to select the analog signal and the second analog signal to drive the headphone driver based on the DAC select signal;
   a high-pass filter control circuit operable to control the first digital multiplexer, the second digital multiplexer, and the third multiplexer on the basis of the DAC select signal and a speaker driver enable signal.

9. The integrated audio driver of claim 8, wherein the high-pass filter control circuit is also operable to enabled or disable the control circuit.

10. A method in a single integrated circuit comprising:
    filtering a digital audio signal with a digital high-pass filter;
    converting the digital audio signal to an analog audio signal;
    driving a speaker with the analog audio signal;
    setting tuning information as a function of a characteristic of the speaker;
    receiving the tuning information from an integrated circuit pin-out; and
    tuning the digital high-pass filter based on the tuning information.

11. The method of claim 10 wherein the tuning information is a control code and the receiving the tuning information comprises:
    receiving a tuning voltage at the integrated circuit pin-out and converting the voltage to the control code.

12. The method of claim 10 wherein the tuning voltage is produced by an external voltage divider comprising two resistors.

13. The method of claim 10 further comprising deactivating the digital high-pass filter when the tuning voltage is essentially the same as the ground voltage.

14. The method of claim 10 further comprising pulling down the tuning voltage to a ground potential when nothing is connected to the integrated circuit pin-out.

15. The method of claim 10 further comprising:
    selecting a first digital audio signal or a second digital audio signal for the filtering on the basis of a DAC selection signal;
    selecting a first digital audio signal or a filtered digital audio signal produced by the filtering for the converting to the analog audio signal on the basis of the DAC selection signal;
    selecting a second digital audio signal or the filtered digital audio signal for converting to a second analog audio signal on the basis of the DAC selection signal; and
    selecting the analog audio signal or the second analog signal for the driving the speaker on the basis of the DAC selection signal.

16. The method of claim 15 further comprising:
    selecting the analog audio signal or the second analog signal for the driving headphones on the basis of the DAC selection signal.

17. An integrated audio driver comprising:
    a tunable digital high-pass filter operable to receive a digital audio signal to produce a filtered digital audio signal;
    a digital to audio converter (DAC) operable to receive the filter digital audio signal from the digital high-pass filter and to produce an analog audio signal;

a speaker driver operable to receive the analog audio signal and to produce a signal to drive a speaker; and a control circuit operable to receive a fixed voltage from an integrated circuit pin-out and to configure the digital high-pass filter on the basis of the voltage, wherein the voltage is based on a characteristic of the speaker.

18. The integrated audio driver of claim 17 wherein the control circuit comprises an analog to digital converter (ADC) that converts the fixed voltage to a control code for the digital high-pass filter.

19. The integrated audio driver of claim 17 wherein the fixed voltage is produced by an external voltage divider comprising two resistors.

20. The integrated audio driver of claim 17 further comprising a resistor coupled between the integrated circuit pin-out and a ground plane of the integrated audio driver to deactivate the tunable digital high-pass filter when no voltage is applied to the integrated circuit pin-out.

* * * * *